United States Patent [19]

Bailey

[11] 4,378,410

[45] Mar. 29, 1983

[54] COMPLIANT GLASS FOR SOLID STATE DEVICES

[75] Inventor: Robert F. Bailey, Rossmoor, Calif.

[73] Assignee: Rockwell International Corporation, El Segundo, Calif.

[21] Appl. No.: 274,846

[22] Filed: Jun. 18, 1981

Related U.S. Application Data

[63] Continuation-in-part of Ser. No. 157,144, Jun. 6, 1980, abandoned.

[51] Int. Cl.³ .......................... B32B 9/04; H01L 29/34
[52] U.S. Cl. ................................. 428/448; 106/286.5; 357/52; 357/73; 365/39; 427/93; 427/131; 428/428; 428/432; 428/692; 428/693
[58] Field of Search ...................... 501/54; 106/286.5; 427/131, 93; 357/73, 52; 428/328, 428, 432, 633, 900, 448, 450, 692, 693; 365/39

[56] References Cited

U.S. PATENT DOCUMENTS

| | | | |
|---|---|---|---|
| 3,876,437 | 4/1975 | Otsuka et al. | 501/32 |
| 3,917,495 | 11/1975 | Horn | 357/52 |
| 4,080,621 | 3/1978 | Funakawa et al. | 357/13 |
| 4,148,761 | 4/1979 | Kazmierowicz | 428/432 |
| 4,172,758 | 10/1979 | Bailey et al. | 427/131 |
| 4,272,347 | 6/1981 | Casey et al. | 427/131 |
| 4,293,325 | 10/1981 | Chirino et al. | 106/286.5 |

OTHER PUBLICATIONS

IBM Technical Disclosure Bulletin, vol. 20, No. 1, Jun. 1977, Single-Level Metallurgy Process for Fabrication of Bubble.
Overlays by L. T. Romansiw, pp. 394–395.

*Primary Examiner*—Jerome W. Massie
*Attorney, Agent, or Firm*—H. Fredrick Hamann; Daniel R. McGlynn

[57] ABSTRACT

A solid state device including glass containing $SiO_2$, consisting essentially of the composition, in percent by weight, in the range of:

| | |
|---|---|
| $SiO_2$ | 95–99.5 |
| Al | 0.5 to 5.0. |

3 Claims, 1 Drawing Figure

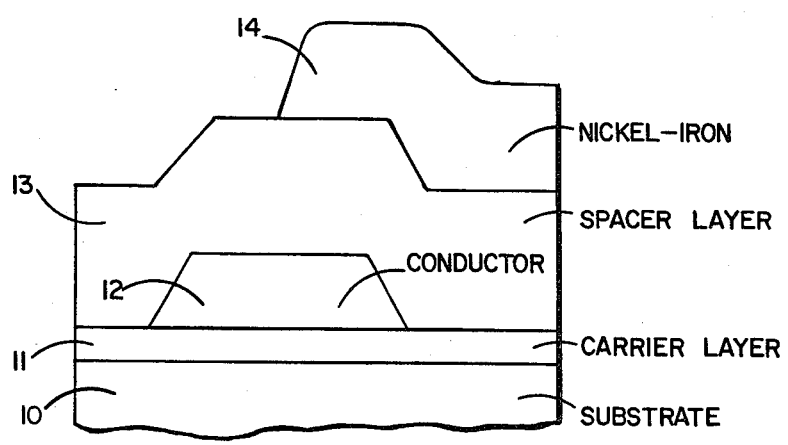

COMPLIANT GLASS FOR SOLID STATE DEVICES

The invention described herein was made in the performance of work under NASA Contract No. NAS 1-22981 and is subject to the provisions of Section 305 of the National Aeronautics and Space Act of 1958 (72 Stat. 435; 42 U.S.C. 2457).

This application is a continuation in part of U.S. Appl. Ser. No. 157,144, filed June 6, 1980, now abandoned.

FIELD OF THE INVENTION

The invention relates to glass which is suitable for the fabrication of solid state electronic devices, and to devices in which layers of such glass are used. The invention also relates to the method of making such glass, and solid state device fabrication processes using such glass.

DESCRIPTION OF THE PRIOR ART

The use of various types of glasses for application in solid state or semiconductor devices are well known in the art. Although most "glasses" associated with semiconductor devices consist actually of silicon dioxide formed directly from silicon substrate material or epitaxial silicon layers, a number of other types of glasses are known in the prior art which do not derive from the substrate material. Many of these classes are associated with passivating glass coatings, such as protecting the semiconductor junctions from atmospheric influences such as ions, or other contaminates. Examples of such glasses are discussed in U.S. Pat. No. 4,156,250. Examples of glasses having certain high insulating properties are known, for example, from U.S. Pat. No. 3,876,437.

The mechanical properties of such glasses have not been of particular importance for applications in semiconductor devices. However, with the development of solid state devices incorporating mangetic films, such as magnetic bubble domain devices, the mechanical properties of the various layers associated with the composite structure forming such devices have great impact upon the magnetic properties of the layer supporting the magnetic bubbles. These mechanical properties include, for example, low stiffness and high compliance. Although substantially pure $SiO_2$ layers have been used as dielectric layers, such layers transmit the stress associated with metallic layers in the composite, thus creating a stress in the magnetic film layer which adversely affects the magnetic operational characteristics of the layer. This is especially true with "high strength" glasses, of the prior art, such as described in U.S. Pat. No. 3,876,437. Reference is also made to copending U.S. Patent Application, Ser. No. 928,487, Oeffinger et al, now abandoned, and assigned to the common assignee, as describing a dielectric layer in a planar composite structure. Although there is stress associated with planar structures, the problem becomes more severe in non-planar structures. Prior to the present invention, there has not been a suitable dielectric or paramagnetic material for use in composite structures forming such solid state devices which have suitable mechanical properties to avoid adverse effects in the magnetic film layer.

SUMMARY OF THE INVENTION

Briefly, and in general terms, the invention provides a glass containing $SiO_2$ suitable for use in solid state devices, consisting essentially of the composition, in percent by weight, in the range of:

| | |
|---|---|
| $SiO_2$ | 95–99.5 |
| Al | 0.5 to 5.0 |

The invention is also concerned with a solid state device provided with a layer of the glass having the composition recited above.

Another feature of the present invention is the method of making such a glass, and depositing such glass as a layer on a composite device. The preferred deposition technique is vacuum vapor deposition such as evaporation or sputtering.

The novel features which are considered as characteristic for the invention are set forth in particular in the appended claims. The invention itself, however, both as to its construction and its method of operation, together with additional objects and advantages thereof will be best understood from the following description of specific embodiments when read in connection with the accompanying drawings.

BRIEF DESCRIPTION OF THE DRAWINGS

The single FIGURE shows a cross-sectional view of a solid state device, such as a magnetic bubble domain device, including a layer of glass having a composition as taught by the present invention.

DESCRIPTION OF THE PREFERRED EMBODIMENTS

Turning now to FIG. 1 there is shown a cross-sectional view of a composite structure forming a solid state device, such as a magnetic bubble domain device.

Examining the figure in detail, there is shown a suitable substrate 10, such as a semiconductor substrate material or a magnetic bubble domain substrate material. An example of a magnetic bubble domain substrate material is a garnet, such as GGG-gadolinium gallium garnet. The substrate 10 may include a thin layer of material capable of supporting magnetic bubble domains on a major surface thereof. The entire substrate together with a magnetic bubble domain layer may be of any suitable thickness, but is preferably around 20 mils.

Deposited over the surface of the thin layer on the substrate 10 is a planar barrier layer 11 of a suitable dielectric isolation material, preferably composed of the glass according to the present invention. The thickness of the glass is from 1,000 to 4,000 Angstroms. The glass may be deposited on the substrate 10 by means of a vacuum vapor process such as sputtering or evaporation.

Over the barrier layer 11 is formed a layer 12 of a conductive material. Such a layer consists of discrete spaced apart conductor elements or strips having a thickness of approximately 4,000 Angstroms. The conductive layer 12 is formed of any suitable conductive material, with the specific type chosen as a function of the characteristics required by the microelectronic device. In a bubble domain device, the conductor may be copper doped aluminum, although any other suitable conductive material may be utilized as well. The conductor layer 12 may be deposited by the same technique as a deposition of the barrier layer 11, that is, by sputtering or evaporation.

Due to the composition of the conductive layer 12 and its method of deposition, the patterns formed from the layer after masking and etching have a considerable amount of stress which may be transmitted through the barrier layer 11 to the magnetic film layer 10. The effect of stress on the magnetic properties of a magnetic film layer is well known in the art. One adverse consequence is that stress may appreciably change the operating characteristics of the solid state device (e.g. the magnetic operating characteristics). It is therefore important that the barrier layer have specific mechanical properties so that the stress in the conductor layer 12, or other layers, is effectively isolated from the magnetic layer 10. This isolation is achieved by providing a suitable material with low intrinsic compressive stress between the magnetic layer 10 and the deposited layer or layers thereover. The composition of the barrier layer is preferred as a glass film which has a suitable low intrinsic compressive stress.

It is also preferred that the glass film have a low shear strength or low stiffness. Another desired mechanical property of the barrier layer is high compliance. The effect of these mechanical properties is that any such stress which is developed in the conductor layer patterns is transmitted to the barrier layer 11 and such energy is disipated within the layer and does not couple to the magnetic film layer 10.

One glass that has such properties of high compliance and low stiffness has the following composition in percent by weight:

| | |
|---|---|
| $SiO_2$ | 95 to 99.5 |
| Al | 0.5 to 5.0 |

Such glass may be made by beginning with a crucible consisting essentially of substantially pure $SiO_2$ in the form of a powder, mixed together with substantially pure Aluminum powder in the proportion indicated, and heating the crucible until the components sinter so that a glass of the desired composition is formed.

It is known that ordinary $SiO_2$ glass may contain a wide-range of impurities particularly alkali oxides such as $Na_2O$ or other oxides such as $B_2O_3$. (Reference may be made to U.S. Pat. No. 3,876,437). The presence of these or other impurities in the glass has been found not to significantly interfere with the high compliance and low stiffness essentially due to the Aluminum component in the glass. The glass based upon a silicon dioxide with impurities consisting of Sodium and Boron compounds may have the following composition in percent by weight:

| | |
|---|---|
| $SiO_2$ | 89–98.45 |
| Al | 0.5–5.0 |
| Na | 0.05–1.0 |
| B | 0.1–5.0 |

Although any glass with a composition in the above ranges is believed to have sufficiently low stiffness and high compliance to be useful in the applications according to the present invention, and in particular used as a barrier layer or spacer layer in a magnetic bubble domain composite solid state device, the preferred glass has the following composition in percent by weight:

| | |
|---|---|
| Al | 1.0–2.0 |
| $SiO_2$ | 97.0–99.0 |
| Other impurities | 0.0–1.0 |

Over the conductor layer 12 another layer of paramagnetic material may be deposited to separate the conductor material from other active layers of the solid state device. Again such a material may consist of the same type of glass as described in connection with the barrier layer. As shown in the figure, the spacer layer 13 may have a greater thickness from 2,000 to 6,000 Angstroms which separates the barrier layer 11, the conductor layer 12, from discrete patterns or elements 14 which may be used as a second conductive layer or as a layer of magnetically operative elements such as Permalloy or nickel-iron. Such layer 14 may be of a thickness of 4,000 Angstroms and also applied by sputtering or evaporation.

Although any glass with a composition in the above range is believed suitable, the preferred glass has the following composition in percent by weight:

| | |
|---|---|
| Al | 1.0–2.0 |
| $SiO_2$ | 97.0–99.0 |
| Other impurities | 0.0–1.0 |

While the invention has been illustrated and described as embodied in a glass for solid state devices and method of fabrication, it is not intended to be limited to the details shown, since various modifications and structural changes may be made without departing in any way from the spirit of the present invention.

It will be obvious to those skilled in the art that the magnetic bubble device according to the present invention can be manufactured with various lighographic technologies and different combinations of known process steps, and that the preferred embodiments illustrated here are merely exemplary. The configuration and distance between the guide elements, as well as their distance to the magnetic bubble layer, can be chosen depending upon the desired properties. These and other variations can be further elaborated by those skilled in the art without departing from the scope of the present invention.

The present invention is also not restricted to the specific magnetic materials and circuits described. For example, it may be pointed out that magnetic materials other than garnet, for example hexagonal ferrites or various crystalline compounds may be used. Moreover, the source, orientation, and frequency of the magnetic field, and the static or dynamic nature of the signals applied to the device may be suitably selected as desired for a particular application.

Without further analysis, the foregoing will so fully reveal the gist of the present invention that others can, by applying current knowledge, readily adapt it for various applications without omitting features that, from the standpoint of prior art, fairly constitutes essential characteristics of the generic or specific aspects of this invention, and therefore, such adaptations should and are intended to be comprehended within the meaning and range of equivalence of the following claims.

What is claimed is:
1. A method of manufacturing a magnetic bubble domain device on a substrate comprising the steps of:

providing a layer of material which supports magnetic bubble domains on said substrate; and providing a dielectric layer on the surface of said layer of material to form a composite, and forming a layer of electrically conductive material on said dielectric layer, characterized in that the dielectric layer deposited on the surface of said layer of material comprises a low intrinsic compressive stress material having low shear strength, low stiffness, and high compliance, consisting essentially of the composition, in percent by weight, in the range of

| | |
|---|---|
| $SiO_2$ | 95–99.5 |
| Al | 0.5–5.0. |

2. A solid state device comprising:

a first layer of solid state material;

a layer of dielectric material disposed on said layer of solid sate material, said dielectric layer comprising a low intrinsic compressive stress material having low shear strenght, low stiffness, and high compliance, consisting essentially of the composition, in percent by weight, in the range of

| | |
|---|---|
| $SiO_2$ | 95–99.5 |
| Al | 0.5–5.0; and | a layer of electrically conductive material disposed on said layer of dielectric material, said layer of electrically conductive material having a mechanical stress associated therewith which is transmitted to said layer of dielectric material.

3. A method of providing a glass layer on a solid state device comprising the steps of:

providing substantially pure $SiO_2$ in powdered form;

mixing substantially pure Al in powdered form with the $SiO_2$;

heating the mixture to form a glass;

applying the glass to the surface of a solid state device to form a dielectric layer comprising a low intrinsic compressive stress material having low shear strength, low stiffness, and high compliance, consisting essentially of the composition, in percent by weight, in the range of

| | |
|---|---|
| $SiO_2$ | 95–99.5 |
| Al | 0.5–5.0. |

* * * * *

UNITED STATES PATENT AND TRADEMARK OFFICE
CERTIFICATE OF CORRECTION

PATENT NO. : 4,378,410
DATED : March 29, 1983
INVENTOR(S) : Robert F. Bailey

It is certified that error appears in the above-identified patent and that said Letters Patent is hereby corrected as shown below:

On the title page under (56) insert -- 3,876,437 4/1975 Otsuka, and 3,917,495 11/1975 Horn --.

Column 1, lihe 6, "1-22981" should read -- 1-12981 --.

Column 1, line 39, "mangetic" should read -- magnetic --.

Column 4, line 38, "lighographic" should read -- lithographic --.

Signed and Sealed this

Twenty-second Day of November 1983

[SEAL]

Attest:

GERALD J. MOSSINGHOFF

Attesting Officer

Commissioner of Patents and Trademarks